(12) United States Patent
Sun et al.

(10) Patent No.: US 8,283,214 B1
(45) Date of Patent: Oct. 9, 2012

(54) METHODS FOR FORMING NICKEL OXIDE FILMS FOR USE WITH RESISTIVE SWITCHING MEMORY DEVICES

(75) Inventors: Zhi-Wen Sun, San Jose, CA (US); Jinhong Tong, Santa Clara, CA (US); Chi-I Lang, Sunnyvale, CA (US); Tony Chiang, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 1203 days.

(21) Appl. No.: 11/963,656

(22) Filed: Dec. 21, 2007

(51) Int. Cl.
*H01L 21/20* (2006.01)
*H01L 21/00* (2006.01)
*H01L 21/16* (2006.01)
*H01L 21/8229* (2006.01)

(52) U.S. Cl. .......... 438/141; 438/104; 257/E21.613
(58) Field of Classification Search .......... 438/104, 438/141
See application file for complete search history.

(56) References Cited

U.S. PATENT DOCUMENTS

| | | | |
|---|---|---|---|
| 5,595,637 A * | 1/1997 | Tench et al. ............... | 205/91 |
| 6,034,882 A | 3/2000 | Johnson et al. | |
| 6,193,871 B1 * | 2/2001 | Coates et al. ............. | 205/170 |
| 6,878,247 B2 * | 4/2005 | Duruz et al. .............. | 204/293 |
| 2002/0171081 A1 * | 11/2002 | Vincent et al. ............ | 257/40 |
| 2006/0073657 A1 | 4/2006 | Herner et al. | |
| 2006/0105355 A1 * | 5/2006 | Maurer ..................... | 435/6 |
| 2006/0215445 A1 * | 9/2006 | Baek et al. ................ | 365/158 |
| 2006/0250836 A1 | 11/2006 | Herner et al. | |
| 2006/0250837 A1 | 11/2006 | Herner et al. | |
| 2007/0114509 A1 | 5/2007 | Herner | |
| 2008/0185567 A1 | 8/2008 | Kumar et al. | |
| 2008/0185572 A1 | 8/2008 | Chiang et al. | |
| 2008/0185573 A1 | 8/2008 | Sun et al. | |
| 2008/0315206 A1 * | 12/2008 | Herner et al. ............ | 257/66 |
| 2009/0001345 A1 * | 1/2009 | Schricker et al. ......... | 257/4 |

OTHER PUBLICATIONS

Jayashree et al., Factors Governing the Electrochemical Synthesis of a Nickel(II) Hydroxide, Journal of Applied Electrochemistry, 1999, pp. 449-454, vol. 29, Kluwer Academic Publishers.
Kim et al., Electrical Observations of filamentary conductions for the resistive memory switching in NiO films, Applied Physics Letters, May 15, 2006, pp. 202102-1-202102-3, vol. 88, American Institute of Physics.

(Continued)

*Primary Examiner* — Charles Garber
*Assistant Examiner* — Calvin Choi

(57) ABSTRACT

Methods for forming a NiO film on a substrate for use with a resistive switching memory device are presenting including: preparing a nickel ion solution; receiving the substrate, where the substrate includes a bottom electrode, the bottom electrode utilized as a cathode; forming a $Ni(OH)_2$ film on the substrate, where the forming the $Ni(OH)_2$ occurs at the cathode; and annealing the $Ni(OH)_2$ film to form the NiO film, where the NiO film forms a portion of a resistive switching memory element. In some embodiments, methods further include forming a top electrode on the NiO film and before the forming the $Ni(OH)_2$ film, pre-treating the substrate. In some embodiments, methods are presented where the bottom electrode and the top electrode are a conductive material such as: Ni, Pt, Ir, Ti, Al, Cu, Co, Ru, Rh, a Ni alloy, a Pt alloy, an Ir alloy, a Ti alloy, an Al alloy, a Cu alloy, a Co alloy, an Ru alloy, and an Rh alloy.

13 Claims, 6 Drawing Sheets

OTHER PUBLICATIONS

Kim et al., Improvement of resistive memory switching in NiO using IrO2, Applied Physics Letters, Jun. 6, 2006, pp. 232106-1-232106-3, vol. 88, American Institute of Physics.

Kinoshita et al., Bias polarity dependent data retention of resistive random access memory consisting of binary transition metal oxide, Applied Physics Letters, Sep. 6, 2006, pp. 103509-1-103509-3, vol. 89, American Institute of Physics.

Murthy et al., A Model for the Galvanostatic Deposition of Nickel Hydroxide, J. Electrochem. Soc., Jul. 1996, pp. 2319-2327, vol. 143, No. 7, The Electrochemical Society.

Seo et al., Reproducible resistance switching in polycrystalline NiO films, Applied Physics Letters, Dec. 6, 2004, pp. 5655-5657, vol. 85, No. 23, American Institute of Physics.

Seo et al., Conductivity switching characteristics and reset currents in NiO films, Applied Physics Letters, 2005, pp. 093509-1-093509-3, vol. 86, American Institute of Physics.

Seo et al., Electrode dependence of resistance switching in polycrystalline NiO films, Applied Physics Letters, 2005, pp. 263507-1-263507-3, vol. 87, American Institute of Physics.

Streinz et al., The Effect of Current and Nickel Nitrate Concentration on the Deposition of Nickel Hydroxide Films, J. Electrochem. Soc., Apr. 1995, pp. 1084-1089, vol. 142, No. 4, The Electrochemical Society.

Wohlfahrt-Mehrens et al., The mechanism of electrodeposition and operation of Ni(OH)2 layers, Solid State Ionics, 1996, pp. 841-847, vol. 86-88, Elsevier Science B.V.

* cited by examiner

METHODS FOR FORMING NICKEL OXIDE FILMS FOR USE WITH RESISTIVE SWITCHING MEMORY DEVICES

BACKGROUND

Non-volatile memory devices based on the resistivity switching of transition-metal oxide materials has become a major focus for developing the next generation universal RAM devices. As may be appreciated, non-volatile memory does not require a constant power supply to retain stored information in contrast to volatile memory, which does require a constant power supply to retain stored information. Thus, non-volatile memory may have advantages for long term storage of critical data.

Many types of materials have been utilized to create non-volatile memory elements. Nickel oxide thin films are one such material. Conventionally, nickel oxide thin films have been prepared through physical-vapor deposition (PVD) methods by reactive sputtering of Ni targets in an $O_2$ enriched environment. In addition, in some examples, conventional methods have generated reproducible resistance switching in an appropriate metal-insulator (NiO thin film)-metal structure with superior performances both in terms of reliability and speed.

Research of nickel oxide thin films has demonstrated that the defect chemistry of those films can play a role in determining the switching performance of the associated memory devices derived from those films. For example, according to some research, the atomic elemental ratio between nickel and oxygen must be carefully controlled to within certain ranges to obtain a desired resistance switching. Current deposition techniques may not provide sufficiently precise control over chemical defects in oxide materials.

As such, methods for forming nickel oxide films for use with resistive switching memory devices are presented herein.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The illustrative examples presented herein are for clarifying embodiments of the present invention. Theses illustrations are not scale representations of embodiments and should not be construed as so limiting with respect to scale and proportion. In addition, the illustrations provided may, in some examples, represent only a portion of an integrated memory device for clarity. Thus, substrates, dielectric materials, conductive materials, semiconductor features, semiconductor devices, or other associated elements or devices may be specifically excluded for the sole purpose of presenting simplified embodiments.

Non-volatile memory devices based on the resistivity switching of transition-metal oxide materials has been a major focus for developing the next generation universal RAM devices. NiO-based oxide thin films prepared from physical-vapor deposition (PVD) methods by reactive sputtering of Ni targets in $O_2$-containing environments have been demonstrated to be able to generate reproducible resistance switching in an appropriate metal-insulator (NiO thin film)-metal structure. Further, it has been established that the defect chemistry of NiO may play a role in determining the switching performance of NiO thin films. In particular, the atomic elemental ratio between Ni and O can be controlled within certain ranges to obtain the resistance switching. However, in some implementations PVD exhibits poor control over the chemical defects in oxide materials. In addition, PVD can be an expensive deposition method due to the complexity of the PVD equipment and associated consumable parts. Therefore, low-cost chemical deposition methods that can generate NiO films with well-controlled chemical defect levels for the non-volatile memory application may be desirable.

Figure 1A:
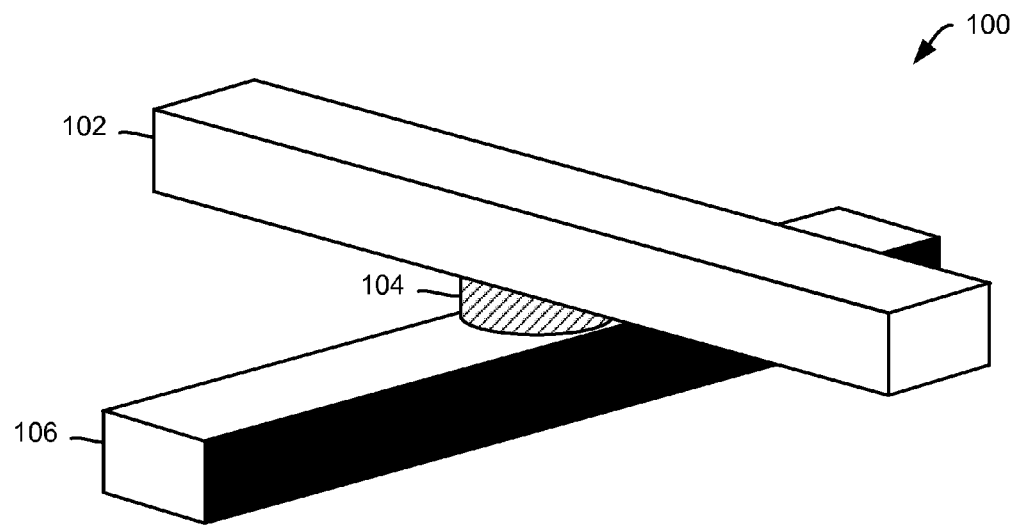
FIG. 1A is an illustrative perspective representation of a resistive switching memory element in accordance with embodiments of the present invention.

FIG. 1A is an illustrative perspective representation of a resistive switching memory device 100 in accordance with embodiments of the present invention. As illustrated, NiO film 104 is disposed on electrode 106. Electrode 106 provides a first conductive element for resistive switching memory element 100. In some embodiments, NiO films may be electrochemically deposited on electrodes utilizing methods provided herein. Electrode 102 provides a second conductive element for resistive switching memory element 100. In some embodiments, electrodes may be formed from Ni, Pt, Ir, Ti, Al, Cu, Co, Ru, Rh, and their alloys. In addition, in some embodiments, NiO film 104 may include a dopant or alloying element such as Co, Li, Mg, and Cr. Dopants, as may be appreciated, may be selected to provide specific and desired switching characteristics for a memory device.

It may be appreciated that electrodes 102 and 106 may be formed in any manner well-known in the art without departing from the present invention including: PVD, CVD, ALD, ECP, and Electroless deposition techniques. In general, memory device 100 forms a memory element equal to one bit. The memory element may have a value of 0 or 1 depending on the resistance across the element. For example, when the resistance across the element is high (e.g., 10 kΩ), the element has a value of 0, and when the resistance is low (e.g., 1 kΩ), the element has a value of 1. The resistance of the element can be changed by changing the resistance of the NiO film 104, which can be changed by applying a voltage across the element (e.g., one voltage to change to a 0, and another voltage to change to 1). The element's value (i.e., resistance) may be determined by using a read voltage that does not disturb the state of the element.

Figure 1B:
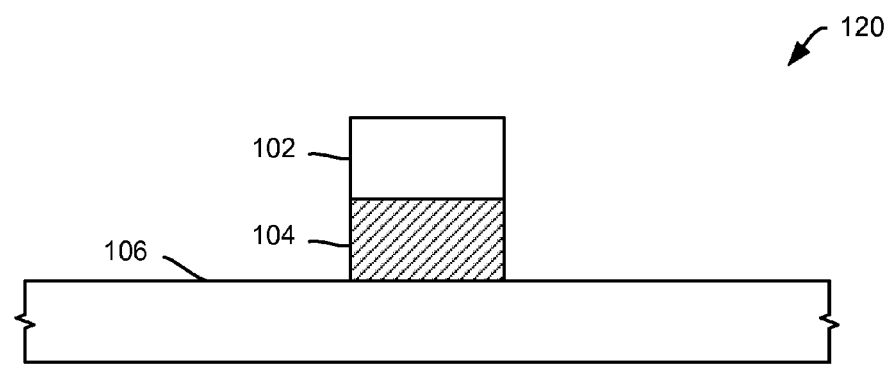
FIG. 1B is an illustrative cross-sectional representation of a resistive switching memory element in accordance with embodiments of the present invention.

FIG. 1B, which corresponds with FIG. 1A, is an illustrative cross-sectional representation of a resistive switching memory element 120 in accordance with embodiments of the present invention. As above, resistive switching memory element 120 includes electrode 106, NiO film 104, and electrode 102. In some embodiments, a buffer layer (not shown) may be formed on NiO film 104 to provide adhesion enhancement and a diffusion barrier.

Figure 2A:
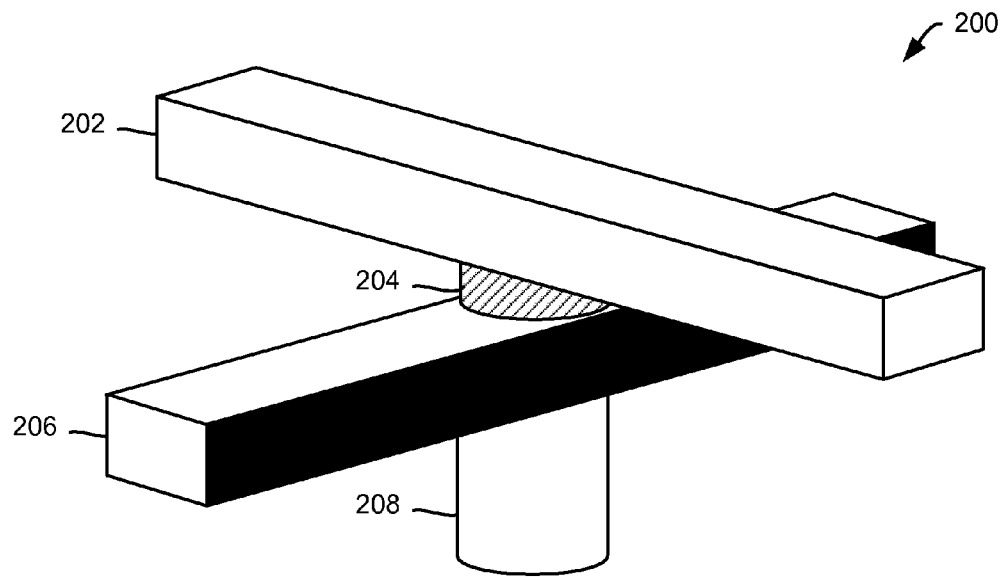
FIG. 2A is an illustrative perspective representation of a resistive switching memory element in accordance with embodiments of the present invention.
Figure 2B:
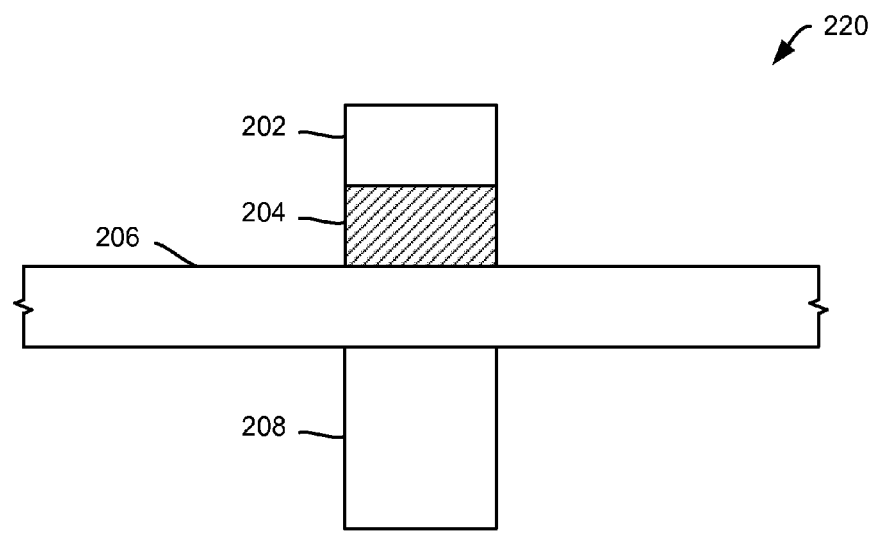
FIG. 2B is an illustrative cross-sectional representation of a resistive switching memory element in accordance with embodiments of the present invention.

FIG. 2A is an illustrative perspective representation of a resistive switching memory element in accordance with embodiments of the present invention. As illustrated, NiO film 204 is disposed on electrode 206. Electrode 206 provides a first conductive element for resistive switching memory element 200. In some embodiments, NiO films may be electrochemically deposited on electrodes utilizing methods provided herein. Electrode 202 provides a second conductive element for resistive switching memory element 200. In some embodiments, electrodes may be formed from Ni, Pt, Ir, Ti, Al, Cu, Co, Ru, Rh, and their alloys. In addition, in some embodiments, NiO film 204 may include a dopant or alloying element such as Co, Li, Mg, and Cr. Dopants, as may be appreciated, may be selected to provide specific and desired switching characteristics for a memory device. It may be appreciated that electrodes 202 and 206 may be formed in any manner well-known in the art without departing from the present invention including: PVD, CVD, ALD, ECP, and electroless deposition techniques. In addition, in some embodiments, resistive memory element 200 may further include current steering element 208, which may include a diode, a resistor, or a transistor. FIG. 2B, which corresponds with FIG. 2A, is an illustrative cross-sectional representation of a resistive switching memory element 220 in accordance with embodiments of the present invention. As above, resistive switching memory element 220 includes electrode 206, NiO film 204, electrode 202, and current steering element 208. In some embodiments, a buffer layer (not shown) may be formed on NiO film 204 to provide adhesion enhancement and a diffusion barrier.

Figure 3:
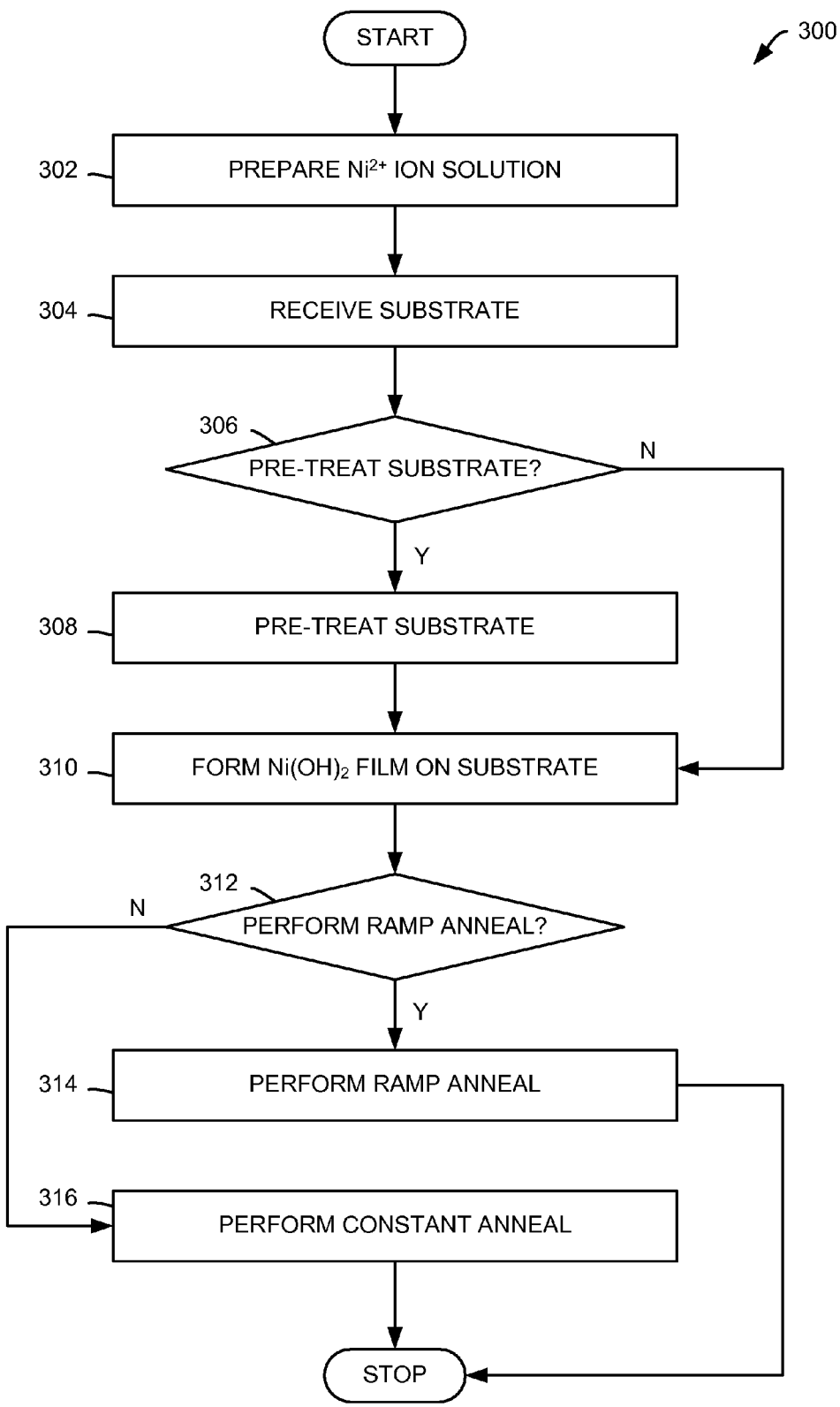
FIG. 3 is an illustrative flowchart for methods for forming a resistive switching memory element on a substrate in accordance with embodiments of the present invention.

FIG. 3 is an illustrative flowchart 300 for methods for forming a resistive switching memory element on a substrate in accordance with embodiments of the present invention. At a first step 302, a $Ni^{2+}$ ion solution is prepared. In embodiments described herein, an appropriate $Ni^{2+}$ ion solution may be prepared from a $Ni(NO_3)_2$ solution having a concentration in the range of approximately 10 mM to 2 M and having an adjusted solution pH in the range of approximately 1.0 to 5.0. In some embodiments, a $Ni(NO_3)_2$ solution may be more preferably prepared having a concentration in the range of approximately 0.1M to 1M and having an adjusted solution pH in the range of approximately 3.0 to 4.0. As may be appreciated, $Ni(NO_3)_2$ solutions may be prepared in any manner well-known in the art without departing from the present invention. In addition, in some embodiments, a dopant such as Co, Li, Mg, and Cr, may be added to a $Ni(NO_3)_2$ solution without limitation. In some embodiments, dopants may be present as nitrate salts in the form of $Co(NO_3)_2$, $LiNO_3$, $Mg(NO_3)_2$, and $Cr(NO_3)_3$ having a concentration range of approximately 1.0 mM to 0.1M.

Figure 4A:
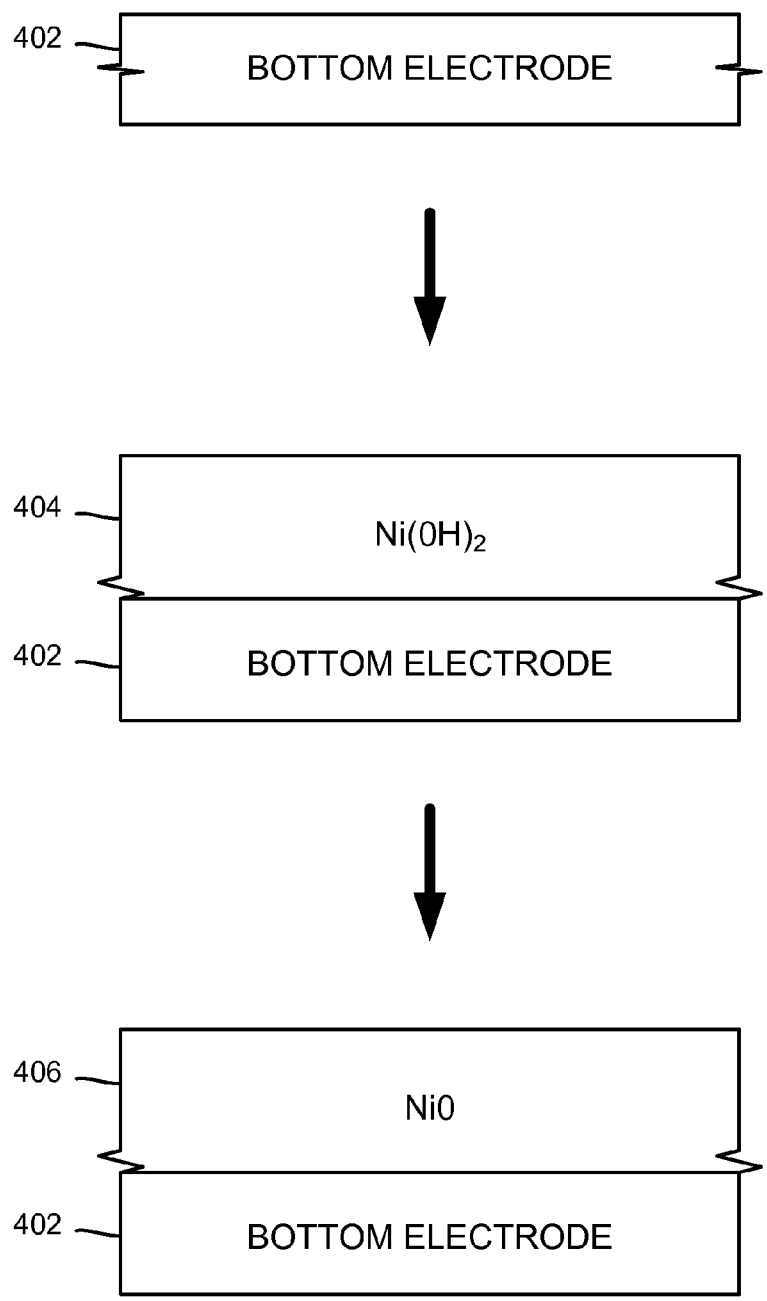
FIGS. 4A-B are illustrative representations of a build-up for a resistive switching memory element utilizing methods described herein in accordance with embodiments of the present invention.

At a next step 304, a substrate is received. A substrate may be received by any configuration capable of performing wet processes without departing from the present invention. As such, in embodiments, a substrate may be immersed in a bath, or may be sprayed in some fashion. Notably, a substrate may include a bottom electrode that may be utilized as a cathode for a subsequent electrochemical deposition step. Referring briefly to FIG. 4A, FIG. 4A is an illustrative representation of a build-up for a resistive switching memory element utilizing methods described herein in accordance with embodiments of the present invention. Thus, a substrate may include a bottom electrode 402 as illustrated. Returning to FIG. 3, at a next step 306, the method determines whether to pre-treat the substrate. A substrate may be pre-treated to enhance adhesion of subsequent layers. If the method determines at a step 306 not to pre-treat the substrate, the method continues to a step 310 to form a $Ni(OH)_2$ film on the substrate. If the method determines at a step 306 to pre-treat the substrate, the method continues to a step 308 to pre-treat the substrate. In some embodiments, pre-treating may include a chemical cleaning or an electrochemical cleaning. Thus, in some embodiments, a chemical cleaning may be performed that includes washing the substrate in an $H_2SO_4$ solution for 30 to 120 seconds (s), where the $H_2SO_4$ solution has a concentration in the range of 0.5 to 2.0 M, and where the solution is maintained at room temperature. In some embodiments, a chemical cleaning may be performed that includes washing the substrate in an $H_2SO_4$ and $HNO_3$ solution for 10 to 60 s, where the $H_2SO_4$ and $HNO_3$ solution has an $H_2SO_4$ concentration of 0.5 to 2.0 M and an $HNO_3$ concentration in a range of 0.1 to 1.0 M, and where the solution is maintained at room temperature.

In some embodiments, an electrochemical cleaning may be performed that includes performing an in-situ cathodic reduction in a deposition bath at a potential of −0.4 to −0.7 volts (V) vs. Ag/AgCl (sat. KCl) for 10 to 60 s. In some embodiments, an electrochemical cleaning may be performed that includes performing a cathodic reduction in an $H_2SO_4$ solution at a potential of approximately −0.4 to −0.7V vs. Ag/AgCl (sat. KCl) for 10 to 60 s where the $H_2SO_4$ solution has a concentration of 0.1 to 1.0 M. As may be appreciated, selection of a chemical cleaning or an electrochemical cleaning may be made on the basis of compatible chemistries without departing from the present invention.

At a next step 310, the method continues to form a $Ni(OH)_2$ film on a substrate. In some embodiments, a $Ni(OH)_2$ film may be formed on a substrate by electrochemically depositing the film on the substrate. As noted above, a substrate may include a bottom electrode that may be utilized as a cathode for a subsequent electrochemical deposition step. Referring briefly to FIG. 4A, a bottom electrode 402 is illustrated having a $Ni(OH)_2$ film 404 formed thereon. As may be appreciated, electrochemical deposition requires an anode, which, in some embodiments, is formed from a conductive material such as Ni, Pt, a Ni alloy, and a Pt alloy. In some embodiments, an electrochemical deposition process proceeds under a set of operational parameters that includes: a current density in a range of approximately 50.0 μA/cm² to 2.0 mA/cm²; a peak current of approximately 0.1 to 1.0 mA/cm², the peak current including a current on/off time ratio in a range of approximately 1:10 to 10:1; and a current scan range of approximately 0.05 to 2.00 mA/cm². In some embodiments, the set of operational parameters more preferably includes: a current density of approximately 0.1 to 0.5 mA/cm²; and a current scan range of approximately 50.0 μA/cm² to 0.5 mA/cm².

In other embodiments, an electrochemical deposition may further include utilizing a reference electrode for use with a potential control waveform. In some embodiments, a potential control waveform proceeds under a set of operational parameters including: an applied potential selected to induce a current flow of approximately 50.0 μA/cm$^2$ to 2.0 mA/cm$^2$; and a potential scan range selected to induce a current flow of approximately 0.05 to 2.00 mA/cm$^2$. In some embodiments, the set of operational parameters more preferably includes: an applied potential selected to induce a current flow of approximately 0.1 to 0.5 mA/cm$^2$. Furthermore, in some embodiments, the reference electrode may include: a hydrogen reference electrode, an Ag/AgCl reference electrode, and a Pt wire pseudo reference electrode. The method then continues to anneal the Ni(OH)$_2$ film.

In some embodiments, co-depositing other materials utilizing techniques described above may be performed. For example, in one embodiment, a Co salt may be co-deposited to form a mixed layer of Co(OH)$_2$/Ni(OH)$_2$. The mixed layer of Co(OH)$_2$/Ni(OH)$_2$ may then be annealed to form a mixed cobalt oxide and nickel oxide layer. Other mixtures are possible as well without departing from the present invention.

Figure 5:
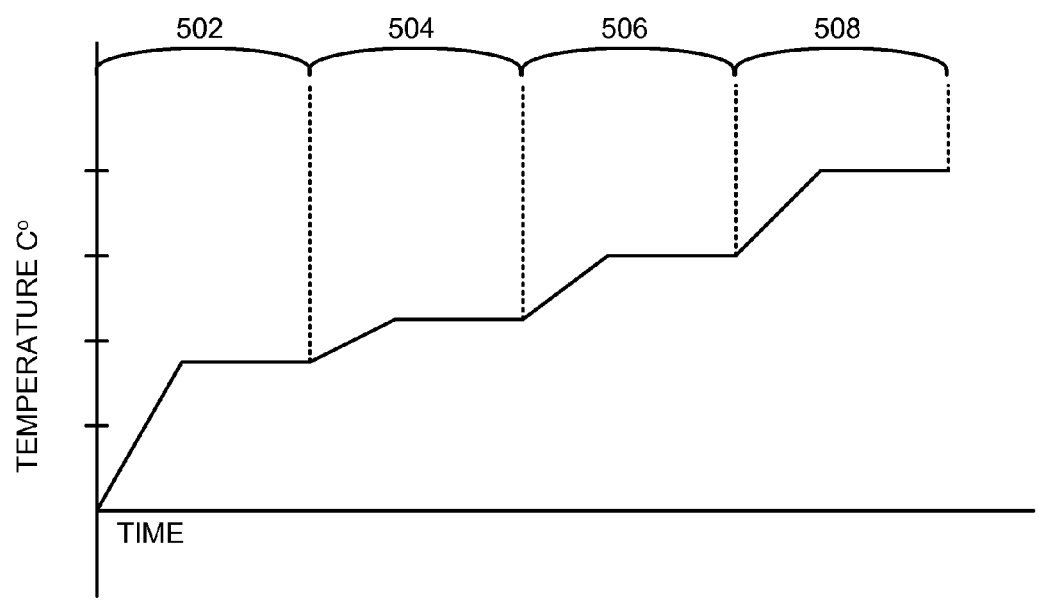
FIG. 5 is an illustrative graphical representation of a ramp anneal in accordance with embodiments of the present invention.

An anneal process may be utilized to convert the Ni(OH)$_2$ film to an NiO film by thermal decomposition of the Ni(OH)$_2$ film 406 as illustrated in FIG. 4A. Two types of annealing may be favorably utilized in embodiments disclosed herein: ramp annealing and constant annealing. Returning to FIG. 3, at a next step 312, the method determines whether to perform a ramp anneal. If the method determines at a step 312 to perform a ramp anneal, the method continues to a step 314 to perform a ramp anneal of a Ni(OH)$_2$ film formed on a substrate. Referring briefly to FIG. 5, FIG. 5 is an illustrative graphical representation 500 of a ramp anneal in accordance with embodiments of the present invention. In some embodiments, a ramp anneal may be performed in four segments. In a first segment 502, the ramp anneal is performed at a temperature of approximately 250 to 350° C. with a ramp rate of approximately 0.1 to 20° C./sec and a holding temperature of approximately 350° C. for approximately 30 to 300 s. In a second segment 504, the ramp anneal is performed at a temperature of approximately 350 to 450° C. with a ramp rate of approximately 0.1 to 20° C./sec and a holding temperature of approximately 450° C. for approximately 30 to 300 s. In a third segment 506, the ramp anneal is performed at a temperature of approximately 450 to 600° C. with a ramp rate of approximately 0.1 to 20° C./sec and a holding temperature of approximately 600° C. for approximately 30 to 300 s. In a fourth segment 508, the ramp anneal is performed at a temperature of approximately 600 to 800° C. with a ramp rate of approximately 0.1 to 20° C./sec and a holding temperature of approximately 800° C. for approximately 30 to 300 s.

Returning to FIG. 3, if the method determines at a step 312 not to perform a ramp anneal, the method continues to a step 316 to perform a constant anneal. In some embodiments, a constant anneal is performed at a temperature of approximately 250 to 800° C. for approximately 10 to 600 s. In some embodiments, methods may include combinations of a ramp anneal and a constant anneal. Thus, in one embodiments, a ramp anneal may be performed followed by a constant anneal. In another embodiment, a constant anneal may be performed followed by a ramp anneal. After the method completes conversion of the Ni(OH)$_2$ film to an NiO film by thermal decomposition (i.e. annealing), the method ends.

Figure 4B:
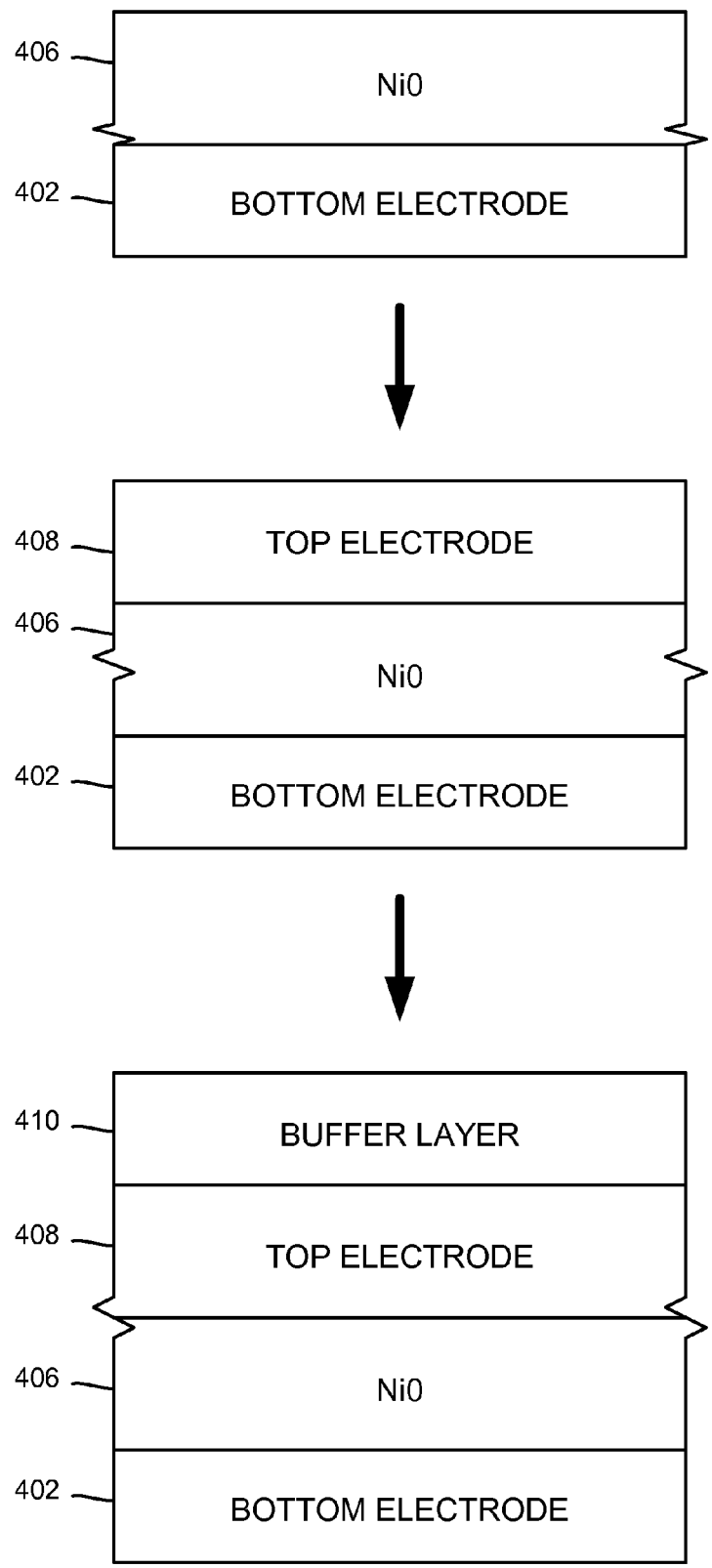

FIG. 4B is an illustrative representation of a build-up for a resistive switching memory element utilizing methods described herein in accordance with embodiments of the present invention. As noted above for FIG. 3, bottom electrode 402 may be utilized as a cathode for an electrochemical deposition of a Ni(OH)$_2$ film. A Ni(OH)$_2$ film may then be converted to NiO film 406 by thermal decomposition. In some embodiments, top electrode 408 may then be formed upon NiO film 406. Top electrodes may be formed on a NiO film in any manner well-known in the art without departing from the present invention. In some embodiments, electrodes may be formed from Ni, Pt, Ir, Ti, Al, Cu, Co, Ru, Rh, and their alloys. It may be appreciated that electrodes 402 and 408 may be formed in any manner well-known in the art without departing from the present invention including: PVD, CVD, ALD, ECP, and Electroless deposition techniques. In addition, in some embodiments, NiO film 406 may include a dopant or alloying element such as Co, Li, Mg, and Cr. Dopants, as may be appreciated, may be selected to provide specific and desired switching characteristics for a memory device. In some embodiments, buffer layer 410 may be formed on top electrode 408 to provide adhesion enhancement and diffusion barrier. As above, buffer layers may be formed on top electrodes in any manner well-known in the art without departing from the present invention.

While this invention has been described in terms of several embodiments, there are alterations, permutations, and equivalents, which fall within the scope of this invention. It should also be noted that there are many alternative ways of implementing the methods and apparatuses of the present invention. Furthermore, unless explicitly stated, any method embodiments described herein are not constrained to a particular order or sequence. Further, the Abstract is provided herein for convenience and should not be employed to construe or limit the overall invention, which is expressed in the claims. It is therefore intended that the following appended claims be interpreted as including all such alterations, permutations, and equivalents as fall within the true spirit and scope of the present invention.

What is claimed is:

1. A method for forming a nickel oxide film, comprising:
preparing a nickel ion solution;
receiving a substrate comprising a bottom electrode utilized as a cathode;
forming a Ni(OH)$_2$ film on the substrate from the nickel ion solution at the cathode during an electrochemical deposition process; and
annealing the Ni(OH)$_2$ film to form a NiO film on the substrate, the NiO film forming a portion of a resistive switching memory element and capable of being switched between two different resistive states.

2. The method of claim 1, wherein the nickel ion solution comprises at least one nitrate salt selected from the group consisting of Co(NO$_3$)$_2$, LiNO$_3$, Mg(NO$_3$)$_2$, and Cr(NO$_3$)$_3$, and the nitrate salt is at a concentration within a range from about 1.0 mM to about 0.1 M.

3. The method of claim 1, wherein the nickel ion solution comprises Ni(NO$_3$)$_2$, has a first concentration of Ni(NO$_3$)$_2$ within a range from about 10.0 mM to about 2.0 M, and has a pH value within a range from about 1.0 to about 5.0.

4. The method of claim 3, wherein the first concentration is within a range from about 0.1 M to about 1.0 M and the pH value is within a range from about 3.0 to about 4.0.

5. The method of claim 1, wherein the electrochemical deposition process has a first set of operational parameters, the first set of operational parameters comprising:
a current density within a range from about 50.0 μA/cm$^2$ to about 2.0 mA/cm$^2$;
a peak current within a range from about 0.1 mA/cm$^2$ to about 1.0 mA/cm$^2$, the peak current
including a current on/off time ratio within a range from about 1:10 to 10:1; and
a current scan range within a range from about 0.05 mA/cm$^2$ to about 2.00 mA/cm$^2$.

6. The method of claim 5, wherein the first set of operational parameters comprises:
- a current density within a range from about 0.1 mA/cm$^2$ to about 0.5 mA/cm$^2$; and
- a current scan range within a range from about 50.0 µA/cm$^2$ to about 0.5 mA/cm$^2$.

7. The method of claim 5, further comprising a reference electrode for utilizing a potential control waveform, wherein the potential control waveform includes a second set of operation parameters, the second set of operational parameters comprises:
- an applied potential selected to induce a current flow within a range from about 50.0 µA/cm$^2$ to about 2.0 mA/cm$^2$; and
- a potential scan range selected to induce a current flow within a range from about 0.05 mA/cm$^2$ to about 2.00 mA/cm$^2$.

8. The method of claim 7, wherein the second set of operations parameters comprises:
- an applied potential selected to induce a current flow within a range from about 0.1 mA/cm$^2$ to about 0.5 mA/cm$^2$.

9. The method of claim 7, wherein the reference electrode is selected from the group consisting of a hydrogen reference electrode, an Ag/AgCl reference electrode, and a Pt wire pseudo reference electrode.

10. The method of claim 1, further comprising:
pre-treating the substrate in an H$_2$SO$_4$ solution for a time period within a range from about 30 seconds to about 120 seconds prior to forming the Ni(OH)$_2$ film, wherein the H$_2$SO$_4$ solution has an H$_2$SO$_4$ concentration within a range from about 0.5 M to about 2.0 M, and wherein the solution is maintained at approximately room temperature.

11. The method of claim 1, further comprising:
pre-treating the substrate in an H$_2$SO$_4$ and HNO$_3$ solution for a time period within a range from about 10 seconds to about 60 seconds prior to forming the Ni(OH)$_2$ film, wherein the H$_2$SO$_4$ and HNO$_3$ solution has an H$_2$SO$_4$ concentration within a range from about 0.5 M to about 2.0 M and an HNO$_3$ concentration within a range from about 0.1 M to about 1.0 M, and wherein the solution is maintained at approximately room temperature.

12. The method of claim 1, wherein pre-treating the substrate is an electrochemical cleaning process comprising:
performing an in-situ cathodic reduction in a deposition bath at a potential within a range from about −0.4 volts to about −0.7 volts vs. Ag/AgCl (sat. KCl) for a time period within a range from about 10 seconds to about 60 seconds, wherein the deposition bath comprises an H$_2$SO$_4$ solution having a concentration within a range from about 0.1 M to about 1.0 M.

13. The method of claim 1, wherein the annealing comprises:
performing a constant anneal performed at a temperature within a range from about 250° C. to about 800° C. for a time period within a range from about 10 seconds to about 600 seconds; and
performing a ramp anneal performed in at least four segments, further comprising:
- performing a first segment at a first temperature within a range from about 250° C. to about 350° C. at a first ramp rate within a range from about 0.1° C./sec to about 20° C./sec and a first holding temperature of approximately 350° C. for a time period within a range from about 30 seconds to about 300 seconds;
- performing a second segment at a second temperature within a range from about 350° C. to about 450° C. at a second ramp rate within a range from about 0.1° C./sec to about 20° C./sec and a second holding temperature of approximately 450° C. for a time period within a range from about 30 seconds to about 300 seconds;
- performing a third segment at a third temperature within a range from about 450° C. to about 600° C. at a third ramp rate within a range from about 0.1° C./sec to about 20° C./sec and a third holding temperature of approximately 600° C. for a time period within a range from about 30 seconds to about 300 seconds; and
- performing a fourth segment at a fourth temperature within a range from about 600° C. to about 800° C. at a fourth ramp rate within a range from about 0.1° C./sec to about 20° C./sec and a fourth holding temperature of approximately 800° C. for a time period within a range from about 30 seconds to about 300 seconds.

* * * * *